United States Patent
Lee (10) Patent No.: US 7,876,245 B2
(45) Date of Patent: Jan. 25, 2011

(54) PARALLEL-TO-SERIAL CONVERTING CIRCUIT

(75) Inventor: Geun-Il Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 17 days.

(21) Appl. No.: 12/494,914

(22) Filed: Jun. 30, 2009

(65) Prior Publication Data

US 2010/0328117 A1 Dec. 30, 2010

(30) Foreign Application Priority Data

Jun. 30, 2009 (KR) .................... 10-2009-0058999

(51) Int. Cl.
*H03M 9/00* (2006.01)

(52) U.S. Cl. .................. 341/101; 341/100; 710/71; 711/202

(58) Field of Classification Search ............... 341/100, 341/101; 711/202; 710/71; 370/362
See application file for complete search history.

(56) References Cited

U.S. PATENT DOCUMENTS

| | | | |
|---|---|---|---|
| 6,107,946 A * | 8/2000 | Jeong .......................... 341/101 |
| 6,232,895 B1 * | 5/2001 | Djupsjobacka et al. ...... 341/100 |
| 6,611,217 B2 * | 8/2003 | Buchanan et al. ........... 341/100 |
| 7,039,787 B1 * | 5/2006 | Venkata et al. .............. 711/201 |
| 7,254,691 B1 * | 8/2007 | Ebeling ....................... 711/202 |
| 7,307,558 B1 * | 12/2007 | Karim et al. ................. 341/100 |
| 2004/0081145 A1 * | 4/2004 | Harrekilde-Petersen et al. ............. 370/362 |
| 2006/0109929 A1 * | 5/2006 | Tripathi ...................... 375/272 |
| 2007/0073942 A1 * | 3/2007 | Gregorius et al. ............. 710/71 |

* cited by examiner

*Primary Examiner*—Jean B Jeanglaude
(74) *Attorney, Agent, or Firm*—IP & T Group LLP (57) ABSTRACT

A parallel-to-serial converting circuit includes a first alignment unit configured to receive and serially align parallel data included in a first group selected from a plurality of parallel data and to output serially aligned parallel data. The parallel-to-serial converting circuit also includes a second alignment unit configured to receive and serially align parallel data included in a second group selected from a plurality of parallel data and to output serially aligned parallel data. The parallel-to-serial converting circuit further includes a third alignment unit configured to serially align and output the serially aligned parallel data that is output from the first alignment unit and the second alignment unit. The first alignment unit and the second alignment unit drive an output node in response to activated data of received parallel data.

16 Claims, 9 Drawing Sheets

PARALLEL-TO-SERIAL CONVERTING CIRCUIT

CROSS-REFERENCE TO RELATED APPLICATIONS

The present invention claims priority of Korean patent application number 10-2009-0058999, filed on Jun. 30, 2009, which is incorporated by reference in its entirety.

BACKGROUND OF THE INVENTION

The present invention relates to a parallel-to-serial converting circuit which converts parallel input data into serial data and outputs the serial data.

The demand for a high-speed semiconductor memory device is increasing more and more, but there are physical limitations on the access time of a core area (memory cell array area) of a semiconductor memory device. Therefore, the semiconductor memory device overcomes the physical limitations on the core area by using a method of processing data in parallel internally, serializing data upon data input/output and inputting/outputting it at a high speed. Thus, the semiconductor memory device uses a parallel-to-serial converting circuit for converting internally parallel processed data into serial data and outputting it.

Figure 1:
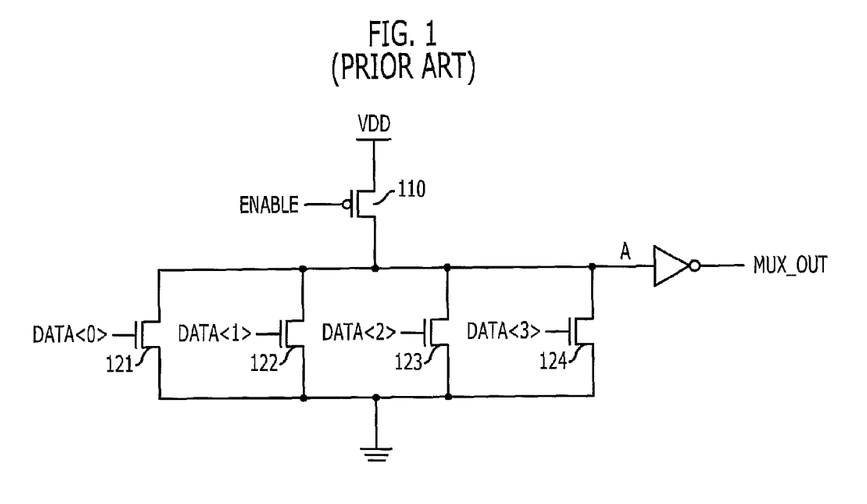
FIGS. 1 and 2 are circuit diagrams showing the configuration of a conventional parallel-to-serial converting circuit.
Figure 2:
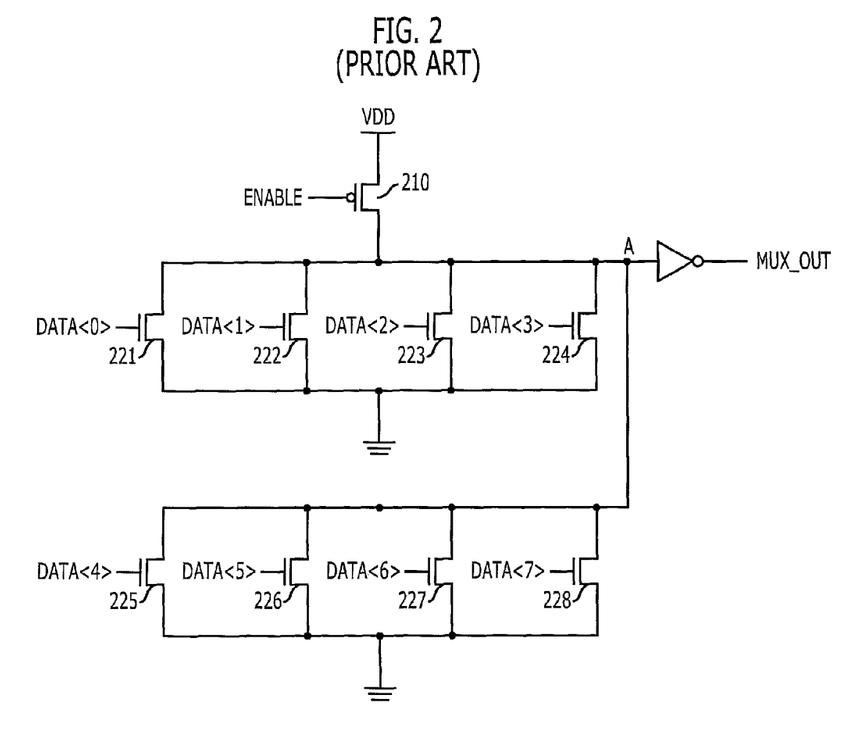

FIGS. 1 and 2 are circuit diagrams showing the configuration of a conventional parallel-to-serial converting circuit, in which FIG. 1 illustrates a circuit which converts data at a ratio of 4:1 and FIG. 2 illustrates a circuit which converts data at a ratio of 8:1.

As shown in the drawings, theses conventional parallel-to-serial converting circuits include pull-up drivers 110 and 210 and a plurality of pull-down drivers 121 to 124 and 221 to 228, respectively.

The pull-up drivers 110 and 210 always pull-up a drive node A while an enable signal ENABLE is activated to 'low'. Since the enable signal ENABLE is a signal which is always kept at 'low' state during the operation of the parallel-to-serial converting circuit, it can be regarded that the pull-up drivers 110 and 210 always pull-up the drive node A.

The pull-down drivers 121 to 124 and 221 to 228 pull-down the drive node A in response to data DATA<0:3> and DATA<0:7>. When the data DATA<0:3> and the DATA<0:7> have a 'high' value, the pull-down drivers 121 to 124 and 221 to 228 pull-down the drive node A; and when the data have 'low' value, the pull-down drivers 121 to 124 and 221 to 228 do not pull-down the drive node A. All of the data DATA<0:3> and the DATA<0:7> have their respective active intervals that do not overlap each other. The active intervals have a value of 'high' or 'low' depending on a logic value of data, while inactive intervals always have a 'low' value regardless of a logic value of data. Therefore, it is determined whether or not to drive the pull-down drivers 121 to 124 and 221 to 228 depending on a logic value of data during an interval when the data DATA<0:3> and the DATA<0:7> are activated, and the pull-down drivers are not driven regardless of a logic value of data during an interval when the data DATA<0:3> and the DATA<0:7> are inactivated.

The pull-up drivers 110 and 210 are always driven, and it is determined whether or not to drive the pull-down drivers 121 to 124 and 221 to 228 depending on a logic value of activated data DATA<0:7>. A logic level of the node A becomes 'high' during an interval when only the pull-up drivers 110 and 210 are driven, and the logic level of the node A becomes 'low' during an interval when the pull-up drivers 110 and 210 and the pull-down drivers 121 to 124 and 221 to 228 are simultaneously driven.

Figure 3:
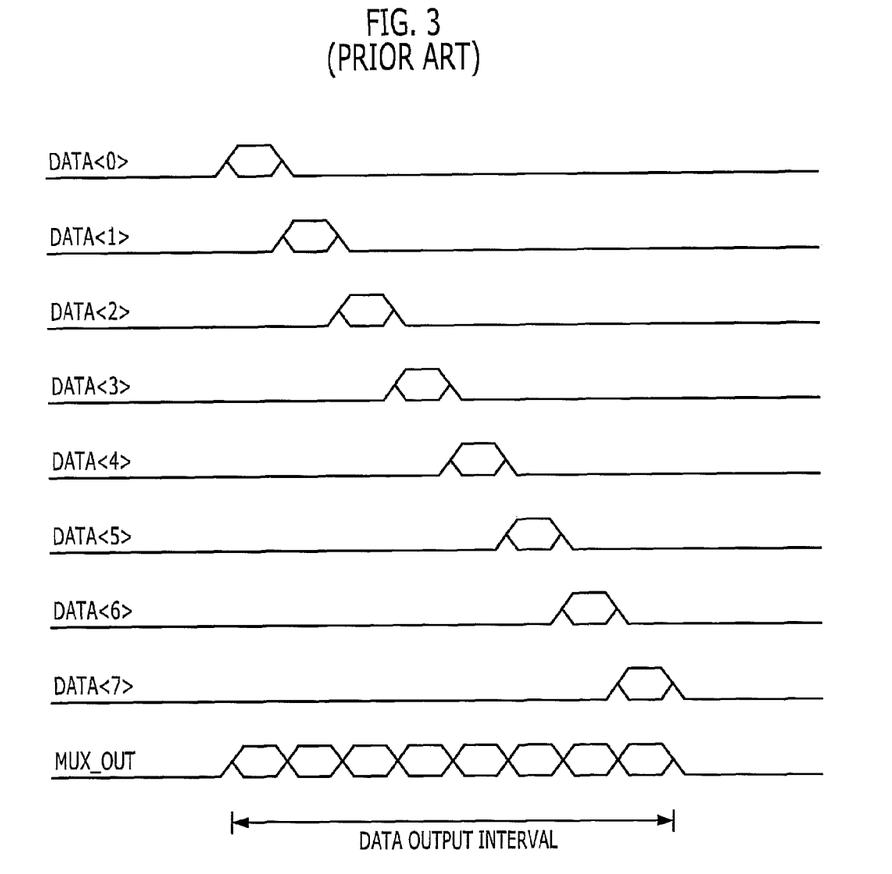
FIG. 3 is a timing diagram showing the operation of FIG. 2.

FIG. 3 is a timing diagram describing the operation of FIG. 2.

Eight data DATA<0:7> have their respective active intervals, and have a 'high' or low' level depending on a logic level of the data DATA<0:7> only during the active intervals and are fixed to low' level during the inactive intervals. Therefore, the pull-down drivers 221 to 228 are driven during respective different intervals to drive the node A, and thus the eight data DATA<0:7> are serially converted and output to an output node MUX_OUT of the parallel-to-serial converting circuit.

In the above-stated parallel-to-serial converting circuit, a signal of the node A is swung at a level of VDD when the logic level is 'high' and at a level of Vth-α (where Vth denotes a turn-on voltage) when the logic level is 'low'. Because of a structure in which the more parallel data DATA are serially aligned, the larger the number of transistors connected to the node A, the line loading and junction capacitor components of the node A becomes larger, which leads to a problem that a signal of the node A and a signal of the output node MUX_OUT are not fully swung to VDD to Vth-α. Moreover, this problem becomes more serious upon high-speed operation, such as 5 Gbps operation. Consequently, there is a need for a parallel-to-serial converting circuit which minimizes jitter upon high-speed operation and stably outputs data.

SUMMARY OF THE INVENTION

Embodiments of the present invention are directed to provide a parallel-to-serial converting circuit which enables high-speed operation stably by reducing line loading and junction capacitor components.

In accordance with an embodiment of the present invention, there is provided a parallel-to-serial converting circuit. The parallel-to-serial converting circuit includes a first alignment unit configured to receive and serially align parallel data included in a first group selected from a plurality of parallel data and to output serially aligned parallel data, a second alignment unit configured to receive and serially align parallel data included in a second group selected from a plurality of parallel data and to output serially aligned parallel data, and a third alignment unit configured to serially align and output the serially aligned parallel data that is output from the first alignment unit and the second alignment unit. The first alignment unit and the second alignment unit drive an output node thereof in response to activated data of received parallel data.

The plurality of parallel data may be configured to have a fixed logic value irrespective of a logic value of data during an inactivated interval.

Each of the first alignment unit and the second alignment unit may include a pull-up driving unit configured to pull-up an output node, and a pull-down driving unit configured to pull-down the output node in response to each of input data.

The third alignment unit may include a NAND gate configured to receive the serially aligned parallel data through the output node of the first alignment unit and the second alignment unit and to generate output data.

The NAND gate may include a dual stacked NAND gate.

The third alignment unit may include a NOR gate configured to receive the serially aligned parallel data through the output node of the first alignment unit and the second alignment unit and to generate output data.

The NOR gate may include a dual stacked NOR gate.

In accordance with another embodiment of the present invention, there is provided a parallel-to-serial converting circuit including a first alignment unit configured to align serially and output parallel data included in a first group in response to a plurality of clocks activated at a different interval, a second alignment unit configured to align serially and output parallel data included in a second group in response to a plurality of clocks activated at a different interval, and a third alignment unit configured to align serially and output the output data of the first alignment unit and the second alignment unit.

The parallel data included in the first group and the second group may be corresponding to the plurality of clocks, respectively, and each of the first unit and the second unit drives an output node thereof in response to the data corresponding to an activated clock of the parallel data.

The parallel data included in the first group and the second group may be corresponded to the plurality of clocks, respectively, and each of the first alignment unit and the second alignment unit includes a pull-up driving unit configured to pull-up the output node thereof and a pull-down driving unit configured to pull-down the output node thereof in response to one of the parallel data and a clock corresponding to the one data.

The pull-down driving unit may include a first transistor configured to be turned on or off in response to a clock corresponding to one of the parallel data, and a second transistor configured to be turned on or off in response to a clock corresponding to the one data, wherein the first transistor and the second transistor are serially coupled to each other and drive the output node.

The third alignment unit may include a NAND gate configured to receive a signal from the output node of the first alignment unit and the second alignment unit, and to generate output data.

The NAND gate may include a dual stacked NAND gate.

The third alignment unit may include a NOR gate configured to receive a signal from the output node of the first alignment unit and the second alignment unit, and to generate output data.

The NOR gate may include a dual stacked NOR gate.

BRIEF DESCRIPTION OF THE DRAWINGS

Features of the present invention will become apparent to those skilled in the art from the following description with reference to the figures, in which.

DESCRIPTION OF SPECIFIC EMBODIMENTS

Hereinafter, the most preferred embodiment of the present invention will be described in detail with reference to the accompanying drawings so that the invention can be easily practiced by those skilled in the art to which the invention pertains.

Figure 4:
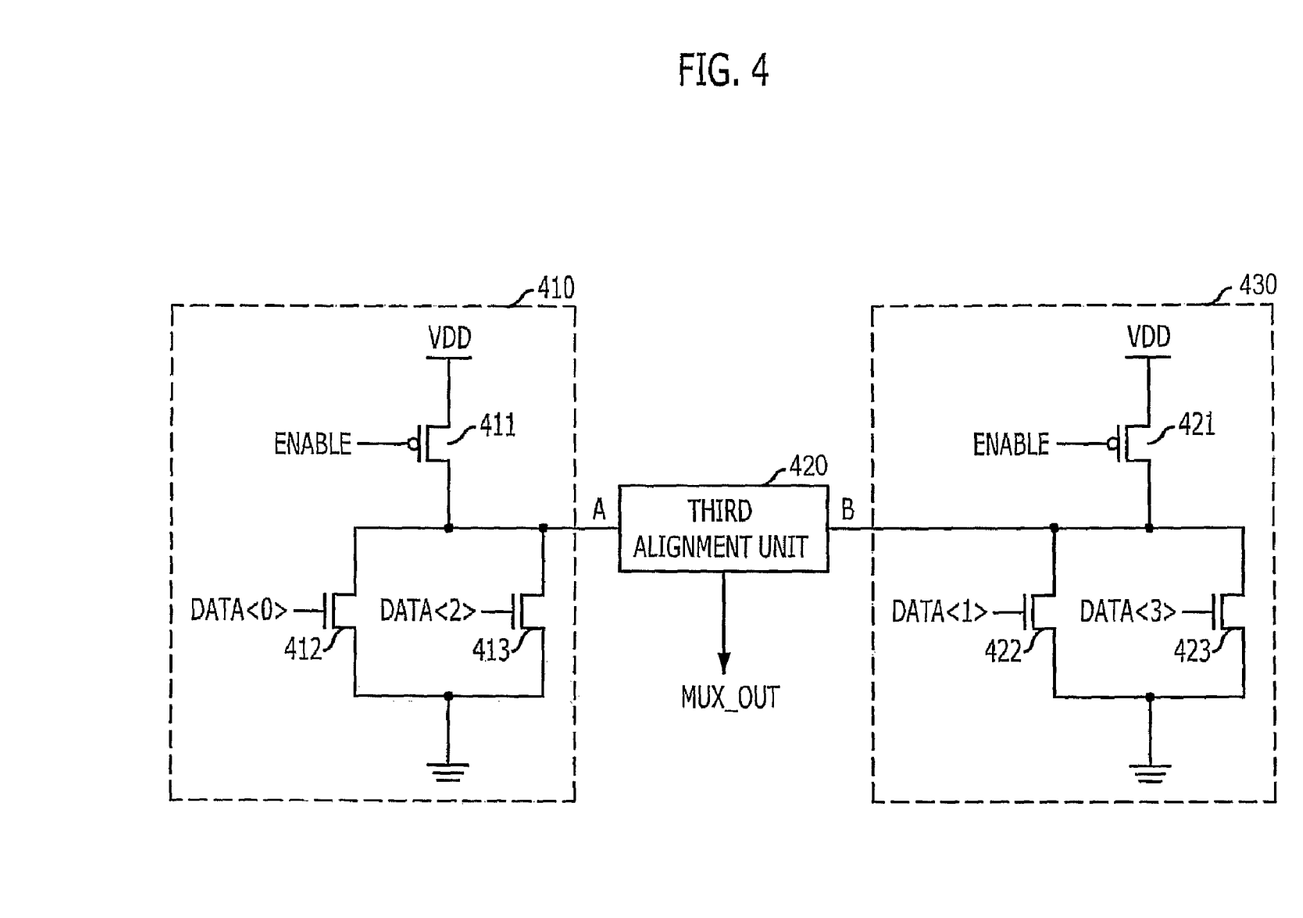
FIG. 4 is a circuit diagram showing the configuration of a parallel-to-serial converting circuit in accordance with a first embodiment the present invention.

FIG. 4 is a circuit diagram showing the configuration of a parallel-to-serial converting circuit in accordance with a first embodiment the present invention.

As shown in FIG. 4, the parallel-to-serial converting circuit of this embodiment includes a first alignment unit 410, a second alignment unit 420 and a third alignment unit 430.

The first alignment unit 410 receives parallel data DATA<0> and DATA<2> included in a first group selected from a plurality of parallel data DATA<0:3>, aligns serially and outputs the parallel data. The third alignment unit 430 receives parallel data DATA<1> and DATA<3> included in a second group selected from the plurality of parallel data DATA<0:3>, aligns serially and outputs the parallel data.

The first alignment unit 410 and the second alignment unit 420 drive an output node A and an output node B in response to activated data of received parallel data, respectively. The third alignment unit 430 aligns serially and outputs the output data of the first alignment unit 410 and the second alignment unit 420.

Active intervals of the parallel data DATA<0:3> do not overlap each other, and the parallel data DATA<0:3> are fixed to a predetermined logic value, regardless of a logic value of data during intervals other than their respective active intervals. That is, the parallel data DATA<0:3> have values corresponding to their logical values during their active intervals but have a fixed value of 'low' during inactive intervals. Such parallel data DATA<0:3> can be generated by an interval adjusting unit of FIG. 7 to be described later.

The first alignment unit 410 drives its output node A in response to active data among the input data DATA<0> and DATA<2>. The first alignment unit 410 is provided with a pull-up driver 411 for pull-up driving the output node A, and pull-down drivers 412 and 413 for pull-down driving the output node A in response to the input data DATA<0> and DATA<2>. The pull-up driver 411 always pull-up drives the output node A during the operation of the parallel-to-serial converting circuit (where an ENABLE signal is always kept at a 'low' level during the operation of the parallel-to-serial converting circuit). Thus, when the pull-down drivers 412 and 413 are not driven, the output node A is always kept at a logic 'high' level. However, a logic level of the output node A becomes 'low' during an interval when the pull-down drivers 412 and 413 are driven. During the active interval of data DATA<0>, whether or not to drive the pull-down driver 412 is determined depending on a logic value of the data DATA<0>. Thus, the logic level of the output node A is determined depending on the logic value of data DATA<0> during the active interval of the data DATA<0>. Likewise, during the active interval of the data DATA<2>, whether or not to drive the pull-down driver 413 is determined depending on a logic value of the data DATA<2>. Thus, the logic level of the output node A is determined depending on the logic value of the data DATA<2> during the active interval of the data DATA<2>.

Since the pull-down drivers 412 and 413 are not driven during intervals other than the active intervals of the data DATA<0> and the data DATA<2>, the output node A is kept at a logic 'high' level. As a result, the data DATA<0> and the DATA<2> are serially aligned and output to the output node A of the first alignment unit 410.

The third alignment unit 430 is configured in the same manner as the first alignment unit 410 except for the data DATA<1> and the DATA<3>. Hence, a logic level of output node B is determined depending on a logic level of the data DATA<1> during an active interval of the data DATA<1>, and is determined depending on a logic level of the data DATA<3> during an active interval of the DATA<3>. During intervals other than the active intervals of the DATA<1> and the data DATA<3>, the pull-down drivers 422 and 423 are not driven, and therefore the output node B is kept at a logic 'high' level. As a result, the data DATA<1> and the DATA<3> are serially aligned and output to the output node B of the second alignment unit 420.

The third alignment unit 430 serially re-aligns the data A and the data B output from the first alignment unit 410 and the second alignment unit 420 and outputs them. The third alignment unit 430 of this type may be composed of a NAND gate or a NOR gate. A more detailed description thereof will be described later with reference to FIGS. 5 and 6.

The parallel-to-serial converting circuit of the present invention performs a converting operation in multiple stages in serially aligning a plurality of data DATA<0:3>. Two pairs of data the DATA<0> and the DATA<2>, and the DATA<1> and the DATA<3> are serially converted at a ratio of 2:1 by means of the first alignment unit 410 and the second alignment unit 420, and the data A and the data B converted by the first alignment unit 410 and the second alignment unit 420 are serially converted again by the third alignment unit 430. Thus, line loading and junction capacitor components of the parallel-to-serial converting circuit are distributed, thereby preventing the problem where data is fully swung.

The embodiment shown in FIG. 4 illustrates that the first alignment unit 410 and the second alignment unit 420 serially convert two pairs of data the DATA<0> and the DATA<2>, and the DATA<1> and the DATA<3>, respectively, and the third alignment unit 430 serially converts the data A and the data B output from the first alignment unit 410 and the second alignment unit 420. However, it is needless to say that the number of data that the first alignment unit 410 and the second alignment unit 420 serially convert may be more than two, and the third alignment unit 430 may be designed to serially convert output data of not only the first alignment unit 410 and the second alignment unit 420 but more than two alignment units.

Also, a low pass filter may be further included in the next stage of the third alignment unit 430. In this case, the first to third alignment units 410 to 430 may eliminate glitches generated by the overlapping of the active intervals of data <0:3> during the data conversion process.

Figure 5:
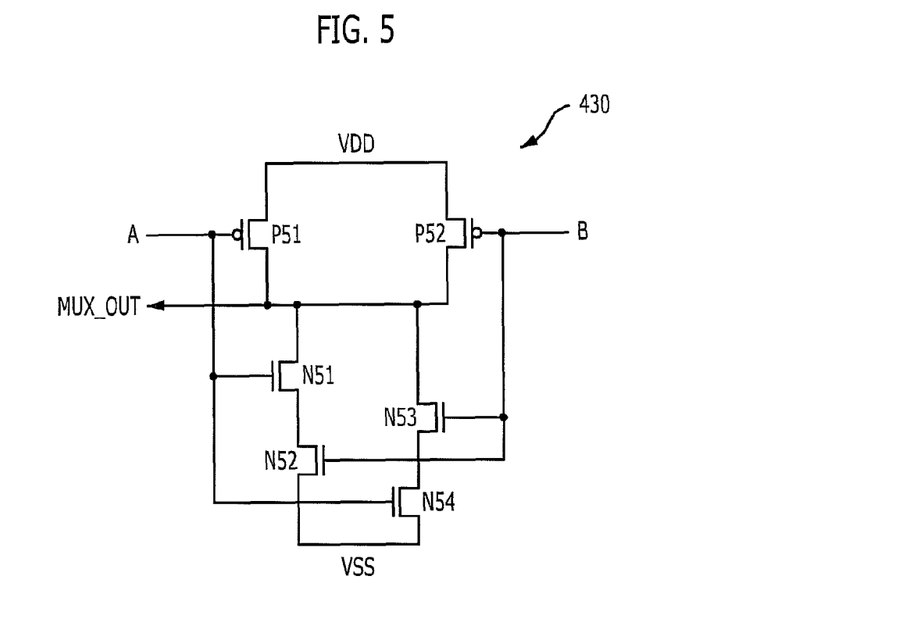
FIG. 5 illustrates a circuit diagram of a first example of the third alignment unit depicted in FIG. 4.

FIG. 5 illustrates a circuit diagram of a first example of the third alignment unit 430 depicted in FIG. 4.

As illustrated in FIG. 5, the third alignment unit 430 may include a dual-stacked NAND gate in which stacked NMOS transistors N51 and N52, and N53 and N54 are configured in a dual manner. In case of using a general NAND gate rather than a dual-stacked NAND gate, since the driving waveforms of the NMOS transistor on the drain side and the NMOS transistor on the source side are different from each other, jitter components of output data MUX_OUT may increase upon a high-speed operation.

The data A and the data B output from the first alignment unit 410 and the second alignment unit 420 have logic values corresponding to the data DATA<0:3> during an active interval, and are fixed to a 'high' level during an inactive interval. An output A from the first alignment unit 410 has a logic value corresponding to data DATA<0> and DATA<2> only during the active intervals of data DATA<0> and DATA<2>, and is fixed to a 'high' level during the inactive intervals of data DATA<0> and DATA<2>. Likewise, an output B from the second alignment 420 has a logic value corresponding to data DATA<1> and DATA<3> only during the active intervals of data DATA<1> and DATA<3>, and is fixed to a 'high' level during the inactive intervals of data DATA<1> and DATA<3>.

Since the active intervals of data DATA<0:3> do not overlap each other, the active intervals of an output A of the first alignment unit 410 and an output B of the second alignment unit 420 do not overlap each other as well. Thus, when the outputs A and B from the first alignment unit 410 and the second alignment unit 420 are input to the NAND gate, the output value MAX_OUT of the NAND gate is determined depending on an activated output value out of the outputs A and B of the first alignment unit 410 and the second alignment unit 420.

By this operation, the third alignment unit 430 serially converts the outputs from the first alignment unit 410 and the second alignment unit 420.

Figure 6:
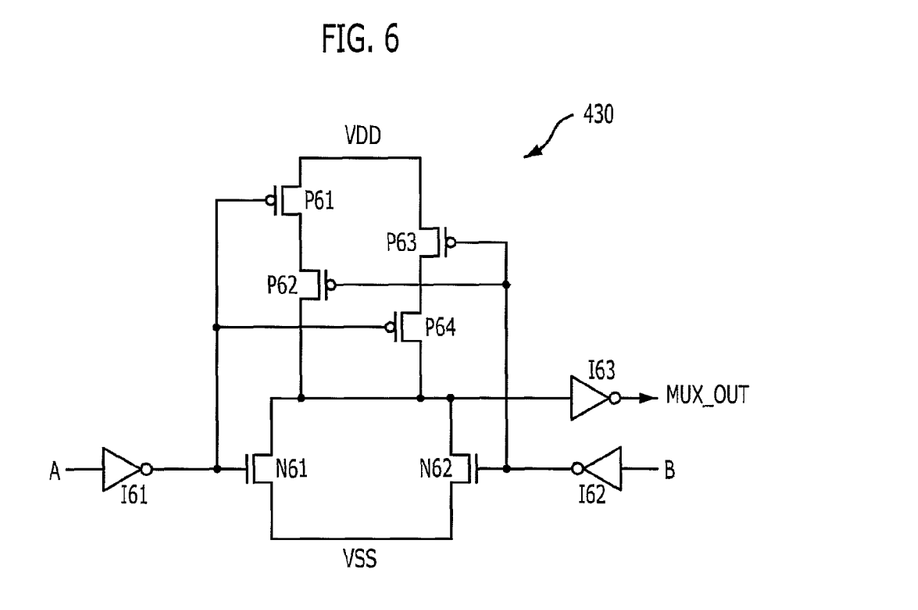
FIG. 6 illustrates a circuit diagram of a second example of the third alignment unit depicted in FIG. 4.

FIG. 6 illustrates a circuit diagram of a second example of the third alignment unit 430 depicted in FIG. 4.

In another embodiment, the third alignment unit 430 may include a dual-stacked NOR gate in which stacked PMOS transistors P61 and P62, and P63 and P64 are configured in a dual manner.

As shown in FIG. 6, the outputs A and B of the first alignment unit 410 and the second alignment unit 420 are fixed to a 'thigh' level during an inactive interval. Thus, the use of the NOR gate alone cannot achieve proper parallel-to-serial conversion. Due to this, inverters 161, 162, and 163 are added. By the addition of the inverters 161 and 162, the data A and the data B input to the NOR gate 610 can be kept at a 'low' level during an inactive interval, which indicates that the output value MUX_OUT of the NOR gate 610 can be varied only by an active output out of the outputs A and B from the first alignment unit 410 and the second alignment unit 420.

By this operation, the third alignment unit 430 serially converts the output A and the output B of the first alignment unit 410 and the second alignment unit 420.

If it is designed that the output A of the first alignment unit 410 and the output B of the second alignment unit 420 are kept at a 'low' level rather than a 'high' level during an inactive interval, conversion may be performed after removing inverters 161, 162, and 163 in FIG. 6. In this case, the inverters should be used rather for the third alignment unit 430 of FIG. 5.

Figure 7:
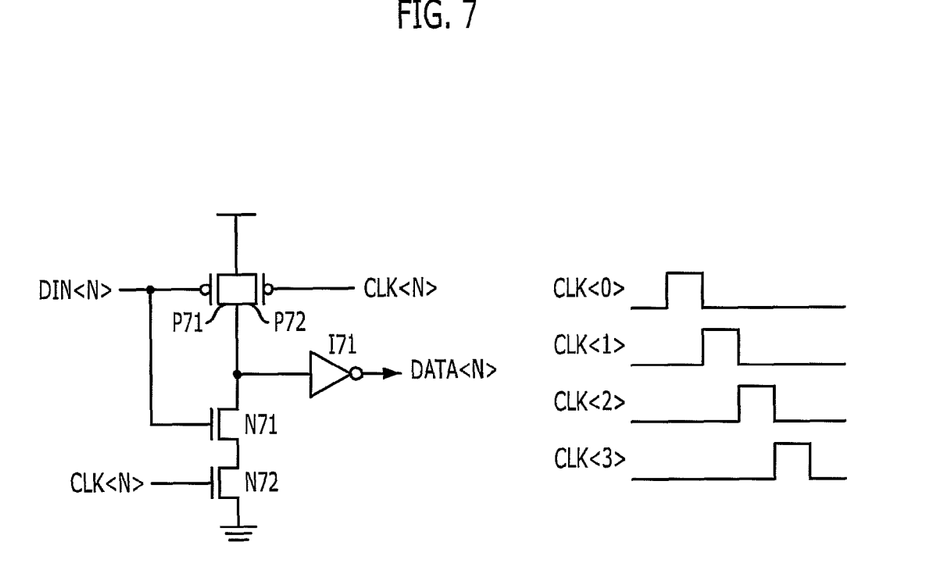
FIG. 7 shows a circuit diagram of an example of an interval adjusting unit for making data have an active interval, and clock signals used therein.

FIG. 7 shows a circuit diagram of an example of an interval adjusting unit for making data have an active interval, and clock signals used therein.

As shown in FIG. 7, the interval adjusting unit includes transistors P71, P72, N71, and N72 and an inverter 171. While data DIN<N> is output as it is (DIN<N>=DATA<N>) during an interval when a clock signal CLK<N> is activated to 'high', its output value DATA<N> is kept at 'low' during an interval when the clock signal CLK<N> is inactivated to 'low'. Therefore, the output data DATA<N> has an active interval only during an interval when the clock signal CLK<N> is activated.

The right part of FIG. 7 illustrates clock signals CLK<0: 3>. It can be seen from the drawing that the active intervals of the clock signals CLK<0:3> do not overlap each other. Since all of output data DATA<0:3> are generated by using different clock signals CLK<0:3>, the output data DATA<0:3> have the active intervals which do not overlap each other.

Figure 8:
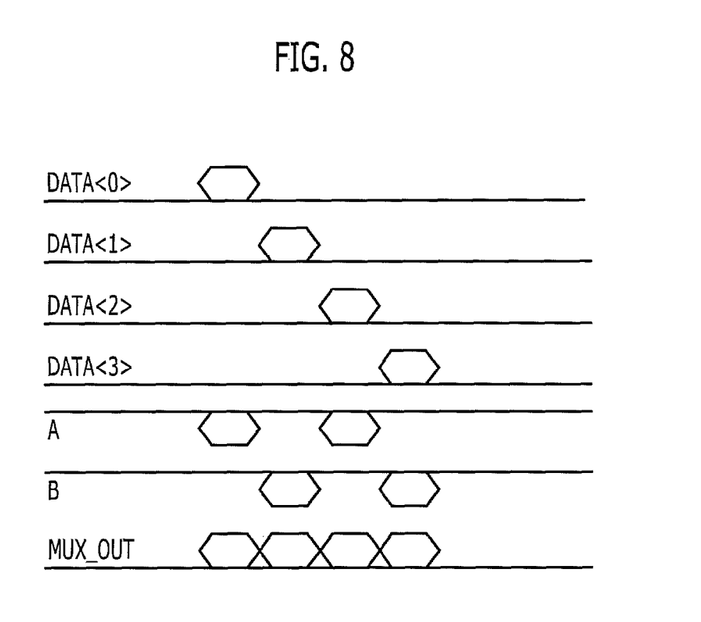
FIG. 8 is a timing diagram showing the overall operation of the parallel-to-serial converting circuit of FIG. 4.

FIG. 8 is a timing diagram showing the overall operation of the parallel-to-serial converting circuit of FIG. 4.

Two data, DATA<0> and DATA<2>, having different active intervals are converted into serial data by the first alignment unit 410. The serially converted data A has a 'high' level during intervals other than the active intervals of the data DATA<0> and the data DATA<2>.

Also, two data, DATA<1> and DATA<3>, having different active intervals are converted into serial data by the second alignment unit 420. The serially converted data B has a 'high' level during intervals other than the active intervals of the data DATA<1> and the data DATA<3>.

The third alignment unit 430 converts the output data A and the out data B from the first alignment unit 410 and the second alignment unit 420 into serial data again. As a result, all of four data DATA<0:3> are converted into serial data, and output through the output terminal MUX_OUT of the third alignment unit 430.

Figure 9:
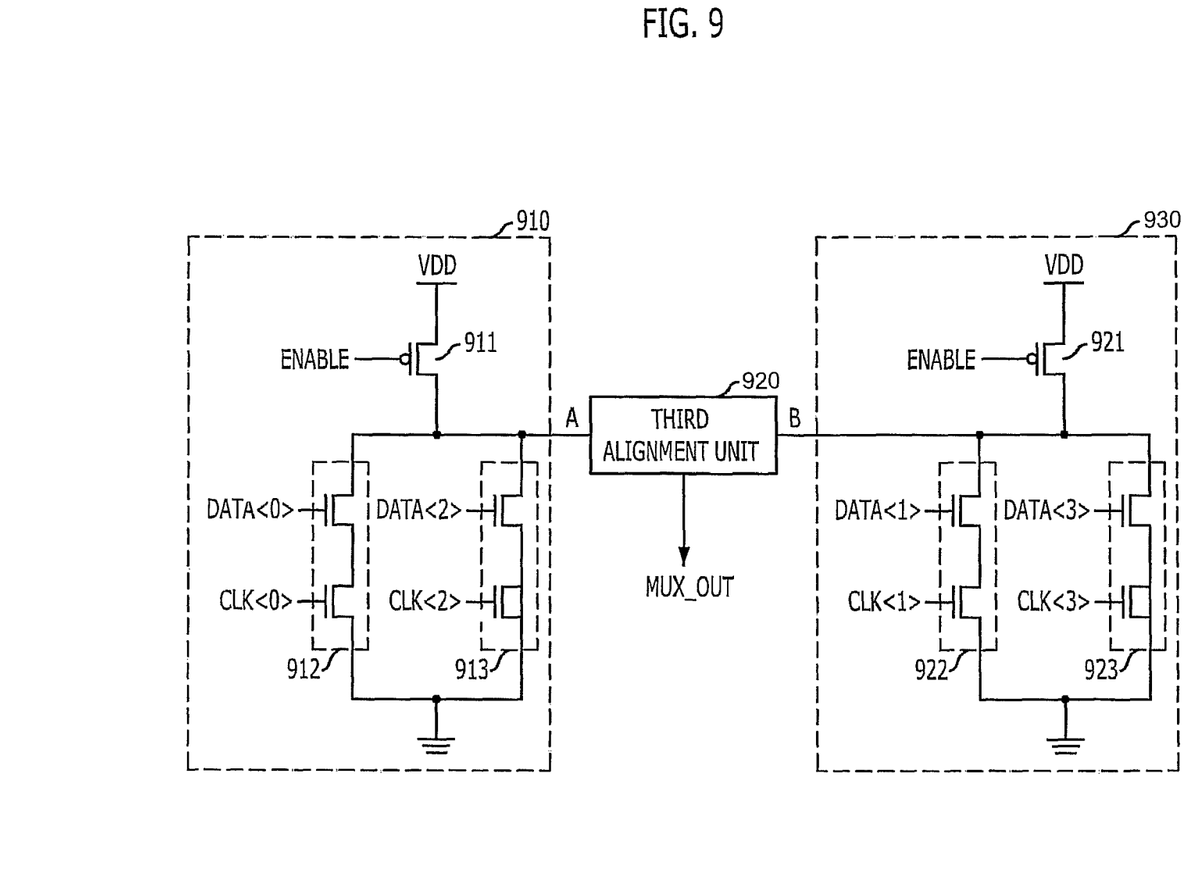
FIG. 9 illustrates a circuit diagram showing the configuration of a parallel-to-serial converting circuit in accordance with a second embodiment of the present invention.

FIG. 9 illustrates a circuit diagram showing the configuration of a parallel-to-serial converting circuit in accordance with a second embodiment of the present invention.

As illustrated in FIG. 9, the parallel-to-serial converting circuit of this embodiment includes a first alignment unit 910, a second alignment unit 920 and a third alignment unit 930.

The first alignment unit 910 aligns serially and outputs parallel data DATA<0> and DATA<2> included in a first group in response to a plurality of clock signals CLK<0> and CLK<2> activated at a different interval.

The second alignment unit 920 aligns serially and outputs parallel data DATA<1> and DATA<3> included in a second group in response to a plurality of clock signals CLK<1> and CLK<3> activated at a different interval.

The third alignment unit 930 aligns serially and outputs the output data of the first alignment unit 910 and the second alignment unit 920.

In the second embodiment of FIG. 9, the first alignment unit 910 and the second alignment unit 920 are configured differently from those of the first embodiment of FIG. 4. The first embodiment illustrates the case in which data having an active interval is input to the first alignment unit 410 and the second alignment unit 420, while the second embodiment illustrates the case in which data DATA<0:3> input to the first alignment unit 910 and the second alignment unit 920 do not need to have an active interval. That is, the first alignment unit 910 and the second alignment unit 920 of the second embodiment perform all the functions that the first alignment unit 410 and the second alignment unit 420 and the interval adjusting unit (FIG. 7) in the first embodiment perform.

The data DATA<0> and DATA<2> input to the first alignment unit 910 and the clock signals CLK<0> and CLK<2> correspond to each other one-to-one, and the first alignment unit 910 drives its output node A in response to data corresponding to the activated clock signals CLK<0> and CLK<2> out of the data DATA<0> and the data DATA<2>. The first alignment unit 910 includes a pull-up driver 911 for pull-up driving the output node, and a plurality of pull-down driver 912 and 913 for pull-down driving the output node A in response to one of the parallel data DATA<0> and DATA<2> and its corresponding clock signals CLK<0> and CLK<2>. The pull-down drivers 912 and 913 are composed of a transistor which is turned on/off in response to the data DATA<0> and DATA<2> and a transistor which is turned on/off in response to the clocks CLK<0> and CLK<2> corresponding to the data DATA<0> and DATA<2>. Because the two transistors are serially connected, if both of the two transistors are turned on, the pull-down drivers 912 and 913 drive the output node A.

The second alignment unit 920 is configured in the same manner as the first alignment unit 910 except for the data DATA<1> and DATA<3> to be input and the clock signals CLK<1> and CLK<3>.

Since the parallel-to-serial converting circuit in accordance with the second embodiment basically operates in the same manner as the parallel-to-serial converting circuit (FIG. 4) in accordance with the first embodiment except for the first alignment unit 910 and the second alignment unit 920, a detailed description thereof will be omitted here.

Figure 10:
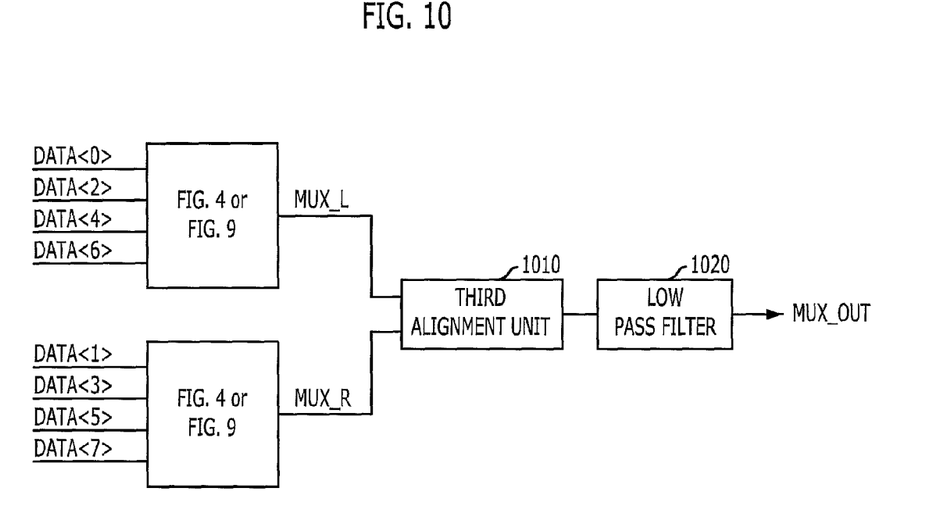
FIG. 10 illustrates a block diagram showing the configuration of a parallel-to-serial converting circuit in accordance with a third embodiment of the present invention.

FIG. 10 illustrates a block diagram showing the configuration of a parallel-to-serial converting circuit in accordance with a third embodiment of the present invention.

As illustrated in FIG. 10, the parallel-to-serial converting circuit of this embodiment may further include a third alignment unit 1010 for serially converting, again, the two output data MUX_L and MUX_R of the parallel-to-serial converting circuit of the first embodiment (FIG. 4) or the second embodiment (see FIG. 9).

The block of FIG. 10 (named as FIG. 4 or FIG. 9) represents the parallel-to-serial converting circuit described in the first embodiment (FIG. 4) or the second embodiment (FIG. 9).

Like the above-described third alignment unit 430, the third alignment unit 1010 may include a NAND gate (see FIG. 5) or a NOR gate (see FIG. 6).

A low pass filter 1020 filters an output from the third alignment unit 1020 before a final output signal MUX_OUT to the parallel-to-serial converting circuit is output, to eliminate glitches generated by the overlapping of the active intervals of data DATA<0:7> during a parallel-to-serial converting operation.

Although FIG. 10 illustrates an example in which eight parallel data are aligned in series through the parallel-to-serial converting circuit, it is needless to say that the number of data that the parallel-to-serial converting circuit converts from parallel to serial may be greater than eight.

Figure 11:
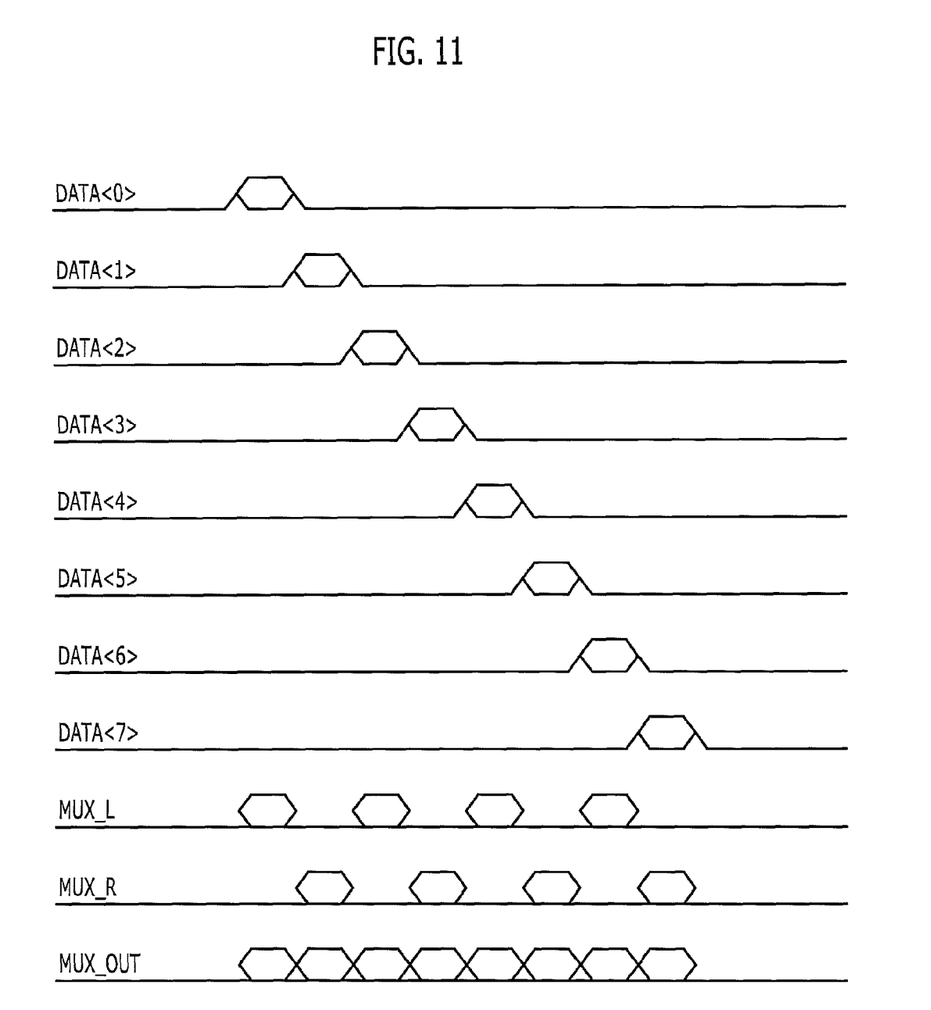
FIG. 11 is a timing diagram showing the overall operation of the parallel-to-serial converting circuit of FIG. 10.

FIG. 11 is a timing diagram showing the overall operation of the parallel-to-serial converting circuit of FIG. 10.

Referring to the drawing, it can be seen that four data DATA<0>, DATA<2>, DATA<4>, DATA<6> and four data DATA<1>, DATA<3>, DATA<5>, DATA<7> are serially converted, respectively, and output as MUX_L and MUX_R, and are serially converted again by the third alignment unit 1010 to output final output data MUX_OUT of the parallel-to-serial converting circuit.

Figure 12:
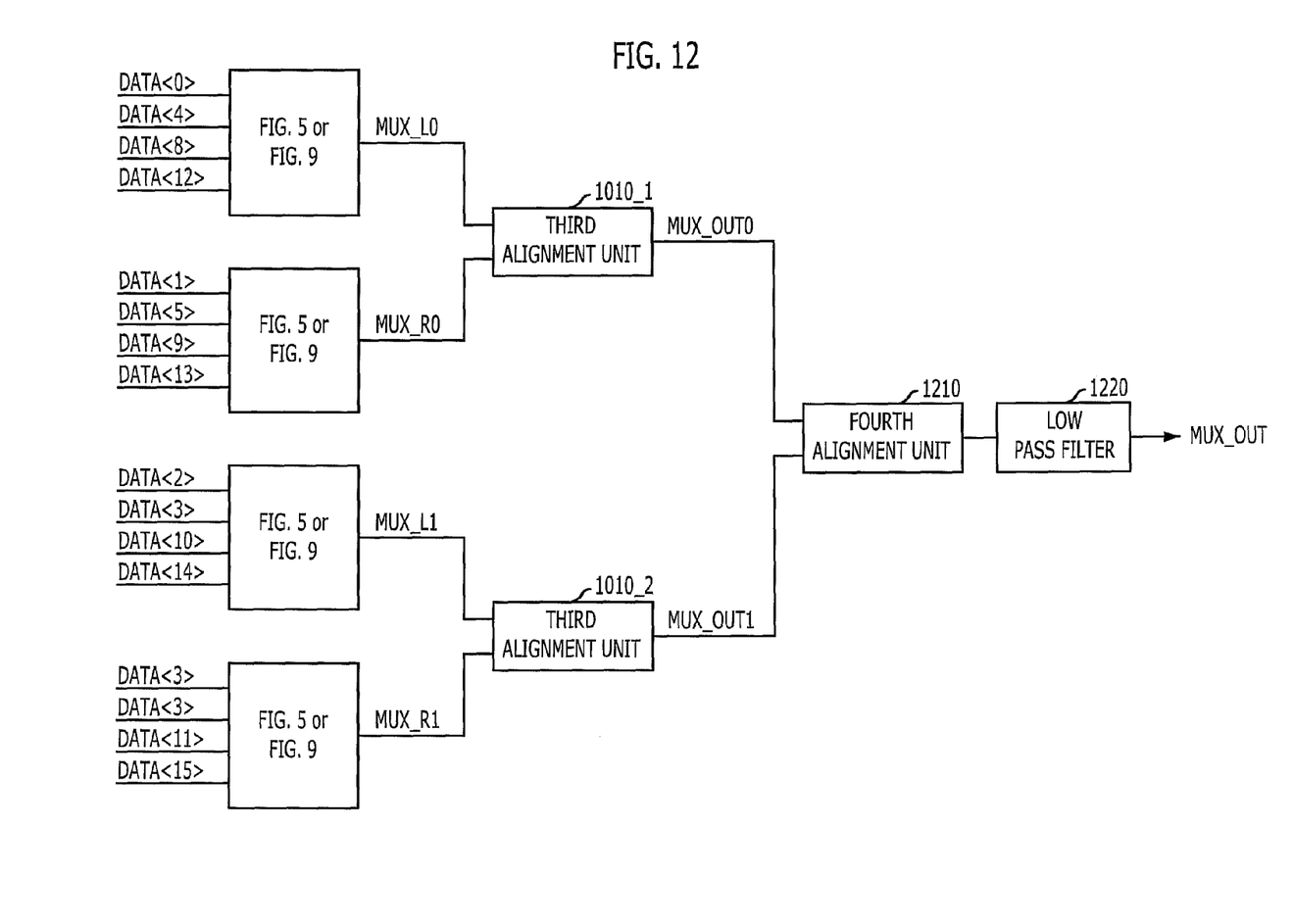
FIG. 12 illustrates a block diagram showing the configuration of a parallel-to-serial converting circuit in accordance with a fourth embodiment of the present invention.

FIG. 12 illustrates a block diagram showing the configuration of a parallel-to-serial converting circuit in accordance with a fourth embodiment of the present invention.

Particularly, FIG. 12 illustrates a parallel-to-serial converting circuit which performs a parallel-to-serial converting operation in four stages.

From the drawing, it can be seen that the parallel-to-serial converting circuit is configured in a manner that the output data MUX_OUT0 and MUX_OUT1 of the third alignment units 1010_1 and 1010_2 are aligned again in series by using a fourth alignment unit 1210.

Like the third alignment unit 430 and the third alignment unit 1010, the fourth alignment unit 1210 may be composed of a NAND gate (see FIG. 5) and a NOR gate (see FIG. 6), too.

As shown in the first to fourth embodiments, the parallel-to-serial converting circuit in accordance with the present invention can be configured in multiple stages freely based on the number of data to be serially converted and the like.

As stated above, the parallel-to-serial converting circuit of the present invention reduces line loading and junction capacitor components generated in an output node by performing an operation of converting parallel data into serial data in multiple stages. Accordingly, a parallel-to-serial converting operation can be stably performed even upon a high-speed operation.

Furthermore, another advantage is that jitter components of high-speed data can be eliminated by using a dual-stacked NAND gate or a dual-stacked NOR gate.

While the present invention has been described with respect to the specific embodiments, it will be apparent to those skilled in the art that various changes and modifications may be made without departing from the spirit and scope of the invention as defined in the following claims.

What is claimed is:

1. A parallel-to-serial converting circuit, comprising:
a first alignment unit configured to receive and serially align parallel data included in a first group selected from a plurality of parallel data and to output the serially aligned parallel data of the first group;
a second alignment unit configured to receive and serially align parallel data included in a second group selected from a plurality of parallel data and to output the serially aligned parallel data of the second group; and
a third alignment unit configured to serially align and output the serially aligned parallel data that is output from the first alignment unit and the second alignment unit,
wherein the first alignment unit and the second alignment unit drive an output node thereof in response to activated data of the received parallel data.

2. The parallel-to-serial converting circuit of claim 1, wherein the plurality of parallel data are configured to have a fixed logic value irrespective of a logic value of data during an inactivated interval.

3. The parallel-to-serial converting circuit of claim 1, wherein each of the first alignment unit and the second alignment unit includes a pull-up driving unit configured to pull-up an output node, and a pull-down driving unit configured to pull-down the output node in response to each input data of the first alignment unit and the second alignment unit.

4. The parallel-to-serial converting circuit of claim 1, wherein the third alignment unit includes a NAND gate configured to receive the serially aligned parallel data through the output node of the first alignment unit and the output node of the second alignment unit and to generate output data.

5. The parallel-to-serial converting circuit of claim 4, wherein the NAND gate includes a dual stacked NAND gate.

6. The parallel-to-serial converting circuit of claim 1, wherein the third alignment unit includes a NOR gate configured to receive the serially aligned parallel data through the output node of the first alignment unit and the output node of the second alignment unit and to generate output data.

7. The parallel-to-serial converting circuit of claim 6, wherein the NOR gate includes a dual stacked NOR gate.

8. A parallel-to-serial converting circuit, comprising:
a first alignment unit configured to serially align and output parallel data included in a first group in response to a plurality of clocks activated at a different interval;
a second alignment unit configured to serially align and output parallel data included in a second group in response to a plurality of clocks activated at a different interval; and
a third alignment unit configured to serially align and output the output data of the first alignment unit and the second alignment unit.

9. The parallel-to-serial converting circuit of claim 8, wherein the parallel data included in the first group and the second group are corresponding to the plurality of clocks and each of the first alignment unit and the second alignment unit drives an output node thereof in response to the data corresponding to an activated clock of the parallel data.

10. The parallel-to-serial converting circuit of claim 8, wherein the parallel data included in the first group and the second group are corresponding to the plurality of clocks and each of the first alignment unit and the second alignment unit includes a pull-up driving unit configured to pull-up the output node thereof and a pull-down driving unit configured to pull-down the output node thereof in response to one of the parallel data and a clock corresponding to the one of the parallel data.

11. The parallel-to-serial converting circuit of claim 10, wherein the pull-down driving unit includes:
a first transistor configured to be turned on and off in response to a clock corresponding to one of the parallel data; and
a second transistor configured to be turned on and off in response to a clock corresponding to the one of the parallel data,
wherein the first transistor and the second transistor are serially coupled to each other and drive the output node.

12. The parallel-to-serial converting circuit of claim 9, wherein the third alignment unit includes a NAND gate configured to receive a signal from the output node of the first alignment unit and the output node of the second alignment unit, and to generate output data.

13. The parallel-to-serial converting circuit of claim 12, wherein the NAND gate includes a dual stacked NAND gate.

14. The parallel-to-serial converting circuit of claim 9, wherein the third alignment unit includes a NOR gate configured to receive a signal from the output node of the first alignment unit and the output node of the second alignment unit, and to generate output data.

15. The parallel-to-serial converting circuit of claim 14, wherein the NOR gate includes a dual stacked NOR gate.

16. A parallel-to-serial converting circuit, comprising:
a first alignment unit configured to receive and serially align parallel data included in a first group selected from a plurality of parallel data and to output the serially aligned parallel data of the first group;
a second alignment unit configured to receive and serially align parallel data included in a second group selected from a plurality of parallel data and to output the serially aligned parallel data of the second group;
a third alignment unit configured to receive and serially align parallel data included in a third group selected from a plurality of parallel data and to output the serially aligned parallel data of the third group; and
a fourth alignment unit configured to serially align and output the serially aligned parallel data that is output from the first alignment unit, the second alignment unit, and the third alignment unit.

* * * * *